United States Patent
Kobayashi

(10) Patent No.: US 6,601,289 B1
(45) Date of Patent: Aug. 5, 2003

(54) MANUFACTURING PROCESS OF SUPERCONDUCTING WIRE AND RETAINER FOR HEAT TREATMENT

(75) Inventor: Shinichi Kobayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/559,377

(22) Filed: Apr. 27, 2000

(30) Foreign Application Priority Data

| May 10, 1999 | (JP) | H11-127886 |
| Jun. 30, 1999 | (JP) | H11-185789 |

(51) Int. Cl.[7] ............................................. H01L 39/24
(52) U.S. Cl. ............................ 29/599; 505/430; 505/500
(58) Field of Search ............................ 29/599; 505/430, 505/433, 500, 501

(56) References Cited

U.S. PATENT DOCUMENTS

| 3,333,331 | A | * | 8/1967 | Swartz ............................ 29/599 |
| 3,661,639 | A | * | 5/1972 | Caslaw ............................ 29/599 |
| 4,135,294 | A | * | 1/1979 | Brown ............................ 29/605 |
| 4,679,020 | A | * | 7/1987 | Kawamura et al. ............ 29/599 |
| 5,102,483 | A | * | 4/1992 | Sawada et al. ............ 156/89.12 |
| 5,293,524 | A | * | 3/1994 | Mookerjee et al. ............ 29/599 |
| 5,318,948 | A | * | 6/1994 | Okada et al. ............... 505/430 |
| 5,426,408 | A | * | 6/1995 | Jones et al. .................. 505/211 |
| 5,506,198 | A | * | 4/1996 | Sato ............................ 505/230 |
| 5,719,106 | A | | 2/1998 | Mukai et al. ................. 505/430 |
| 5,798,312 | A | * | 8/1998 | Okada et al. ................ 505/230 |
| 5,902,774 | A | | 5/1999 | Muranaka et al. ........... 505/433 |
| 5,914,647 | A | * | 6/1999 | Aized et al. ................. 335/216 |
| 6,081,179 | A | * | 6/2000 | Kato ............................ 335/299 |
| 6,239,079 | B1 | * | 5/2001 | Topchiashvili et al. ....... 505/124 |
| 6,400,970 | B1 | * | 6/2002 | Hughson et al. ............. 505/230 |

FOREIGN PATENT DOCUMENTS

| JP | 4-292810 | 10/1992 |
| JP | 6-243745 | 9/1994 |

* cited by examiner

Primary Examiner—David P. Bryant
(74) Attorney, Agent, or Firm—Foley & Lardner

(57) ABSTRACT

It is an object to provide a process for producing a superconducting wire without defects, such as deterioration of characteristics and deformation, in which a superconducting wire having a length of 1 km or more and a high critical electric current density is easily subjected to heat treatment. The first invention comprises a step of inserting a metallic sheath wire, which is formed by filling a superconducting material in a metallic sheath, into a metallic tube having an inner diameter larger than an outer diameter or a width of the metallic sheath wire; and a step of conducting heat treatment under such a condition in that the superconducting wire is wound to overlap a cylindrical fixture to prevent contact with each other while controlling the interior of the metallic tube.

The second invention uses a ceramic board on the heat treatment of a pancake formed by winding the metallic sheath wire on a core. Since the binder of the ceramic board disappears, and the powder or fibers are in a freely movable state, the ceramic board does not restrict shrinkage and expansion of the wire, so as not to cause deformation of the wire. Thus, a long length wire having a length of 1 km or more can be subjected to heat treatment. The characteristics can be improved by conducting the heat treatment under the prescribed conditions of oxygen partial pressure and temperature.

21 Claims, 8 Drawing Sheets

MANUFACTURING PROCESS OF SUPERCONDUCTING WIRE AND RETAINER FOR HEAT TREATMENT

FIELD OF THE INVENTION

The present invention relates to a manufacturing process of a superconducting wire with a heat treatment and a retainer for conducting a heat treatment, and more particularly, it relates to a technique for conducting heat treatment of a long length superconducting wire having a high critical electric current density.

BACKGROUND OF THE INVENTION

Applications utilizing a magnet, such as magnetic resonance imaging (MRI) and superconducting magnetic energy storage (SMES), are recently under development. The copper wire constituting the magnet is being replaced by a superconducting wire. The long length superconducting wire having superconducting characteristics is required for the applications and an electric power cable application.

A typical superconducting wire is produced from a superconducting material, such as NbTi or an oxide superconducting material, by forming with a metallic sheath, and then subjected to heat treatment. The oxide superconducting wire is typically produced in such a manner that an oxide superconducting material or raw material powder thereof is filled into a metallic sheath, and a metallic sheath wire is formed by a plastic deformation process, such as wire drawing or rolling, which is then subjected to heat treatment. In the production of the long length superconducting wires, the said wires are coiled to conduct heat treatment efficiently. Because jointing technique of metallic sheathed superconductor wire has not yet been developed and the characteristics at the jointing part are remarkably deteriorated, it is an important developmental aspect to increase the length of the metallic sheathed superconducting wire.

Another important developmental aspect of the long length metallic sheathed superconducting is the heat treatment. The metallic sheath wire expands and shrinks by heat treatment. In order to conduct heat treatment of the metallic sheath wire without deterioration of the characteristics of the metallic sheath wire, the metallic sheath wire must to move freely without restriction during heat treatment.

Furthermore, there are cases where the superconducting wire is often locally blistered during heat treatment to cause considerable deformation (hereinafter, the phenomenon is referred to as "wire blister"). The cause of the wire blister includes heat expansion of a gas inside the wire. At the part where the wire blister occurs, the critical electric current density Jc is lowered. It has been qualitatively known that the gas suffering the heat expansion to cause the wire blister includes $CO_2$, $H_2O$ and $O_2$.

Moreover, there are cases where the long length metallic sheath wires in contact with each other stick together. In particular, in the case where Cu, Al and Ag of high purity are used as a material of the metallic sheath, the metallic sheath wires tend to stick together.

As a first means for solving the problems, Japanese Patent Laid-open No. Hei6-243745, for example, discloses a technique proposing a method, in which metallic sheath wire is stacked with an intervening material not reacting with the wire, such as a commercially available ceramic tape, and is wound on a core in a pancake form. The term "wound in a pancake form" used herein means that the metallic sheath wire is densely wound in a coil form, and the term "pancake" used herein means the metallic sheath wire densely wound.

A second means for solving the problems proposes a method in which a fixture having a disk shape with a groove extending spirally on a flat surface thereof is provided, and the metallic sheath wire laid in the groove is subjected to heat treatment (described, for example, in Japanese Patent Laid-open No. Hei 4-292810), a method in which a heat resistant paint mainly comprising a silicone resin is coated on the surface of the metallic sheath wire, and a heat resistant coating is formed by heat treatment, which is then subjected to heat treatment, and a method in which a spacer separating the metallic sheath wires is stacked with the metallic sheath wire, which is then directly wound to overlap on a cylindrical fixture.

In the first means, however, there are restrictions on the size of the plate carrying the pancake, which is the metallic sheath wire wound in a pancake form, and the size of the furnace, in which the pancake is subjected to the heat treatment.

In the second means, in using the fixture having a groove spirally extending, because the metallic sheath wire is subjected to heat treatment in the groove spirally extending, there are restrictions on the size of the fixture having the groove and the size of the furnace for the heat treatment thereof, and it is unsuitable for heat treatment of the superconducting wire exceeding 100 m.

SUMMARY OF THE INVENTION

An object of the invention is to solve the problems and to provide a process for producing a long length superconducting wire having a high critical electric current density.

A first invention relates to a process for producing a superconducting wire comprising the steps of: inserting a metallic sheath wire, which is formed by complexing superconducting material or raw material powder thereof and a metal, in a metallic tube having an inner diameter larger than an outer diameter or a width of the metallic sheath wire; and conducting heat treatment of the metallic sheath wire under such a condition in that the metallic sheath wire is inserted in the metallic tube and wound to overlap on a cylindrical fixture. (Hereinafter "complex" or complexing" means form or forming a composite material.) The metallic sheath wire is inserted in the metallic tube to prevent it from contact with the metallic sheath wire. When the metallic sheath wire inserted in the metallic tube is wound on a cylindrical fixture, the metallic sheath wire can freely move without restriction in the metallic tube even at the part forming a step where the metallic tube runs up to an upper layer from a lower layer, and the long length metallic sheath wire can overlap the cylindrical fixture without causing curvature or partial distortion of the metallic sheath wire.

Furthermore, the metallic sheath wire inserted in a metallic tube can be easily obtained by subjecting a long length metallic plate to deformation processing into the metallic tube, and simultaneously inserting the metallic sheath wire into the metallic tube, and the long length superconducting wire can be obtained by winding to overlap a cylindrical fixture, followed by conducting heat treatment.

According to the process, the metallic sheath wire suffers no deformation, such as curvature, even when heat treatment is conducted, and therefore the long length oxide superconducting wire having a high critical electric current density can be produced.

When heat treatment is conducted by controlling the atmosphere inside the metallic tube, into which the metallic sheath wire is inserted, the critical electric current density, on important characteristic of a superconducting wire, can further be improved.

Furthermore, by making a vacuum atmosphere inside the metallic tube, defects, such as blisters of the metallic sheath part of the superconducting wire, can be prevented, so as to obtain the long length superconducting wire.

A second invention relates to a process for producing a superconducting wire, in which even when two or more pancakes each comprising a metallic sheath wire wound in a form of a coil are stacked and subjected to heat treatment, problems, such as deterioration in characteristics, do not occur. That is, the process comprises a step of conducting heat treatment of the two or more stacked pancakes each comprising a metallic sheath wire wound in a form of a coil by using separating means that substantially does not restrict the behavior of the metallic sheath wire for stacking the two or more pancakes in a manner such that the adjacent pancakes are not in contact with each other. According to the process, two or more stacked metallic sheath wires can be treated without interference, and thus space saving can be realized. One of the means of heat treatment without interference of the two or more stacked metallic sheath wires is to apply a protective layer which is provided between the metallic sheath wires to prevent of movement of the metallic sheathed wire without restriction. Because the behavior of the adjacent metallic sheath wires inside the pancake are substantially not restricted by a protective layer, the problems occurring when the metallic sheath wire is restricted, such as deterioration and unfavorable sticking and deformation of the metallic sheath wire, can be resolved. And handling of the metallic sheath wire is also improved.

In the protective layer a spiral groove is provided to lead the metallic sheath wire to another pancake through the spiral groove provided substantially without restriction. Through the groove a superconducting wire having a long single wire length can be treated without termination and adverse effects caused by the restriction, so as to produce the superconducting wire.

The invention also involves a process for treating comprising heat treatment and a retainer for the treatment.

Furthermore, by heat treatment a metallic sheath wire under the suitable conditions such as an oxygen partial pressure, the temperature, the total pressure and the temperature increasing time, a good superconducting wire having an excellent critical electric current density and reduced wire blister formation can be produced.

DETAILED DESCRIPTION OF THE INVENTION

The invention will be described in detail with reference to the drawings.

The first invention is described below.

Figure 1:
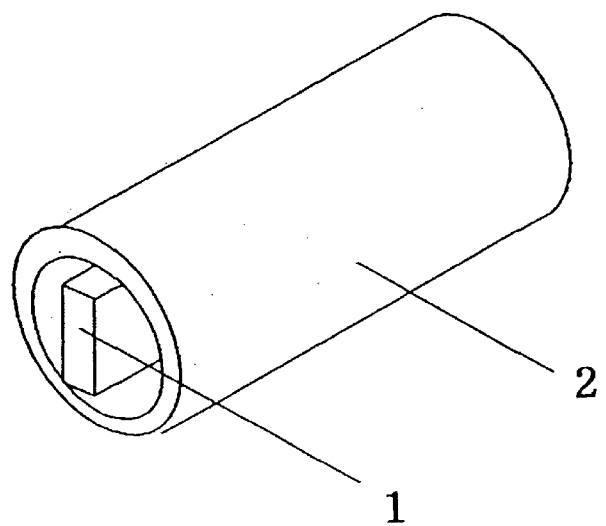
FIG. 1 is a perspective view showing a metallic sheath wire inserted in a metallic tube used in an embodiment of the first invention.

FIG. 1 is a schematic view showing an embodiment of the first invention. It is a perspective view in which a metallic sheath wire 1, formed by complexing a superconducting material or a raw material thereof and a metal, is inserted into a metallic tube 2. In the case where the superconducting material is an oxide superconducting material, a metallic sheath wire 1, which is obtained by filling an oxide superconducting material or raw material powder thereof into a metallic sheath and deforming in the longitudinal direction by wire drawing or rolling, may be inserted into a metallic tube 2.

FIG. 1 shows an example of the metallic sheath wire 1 having a rectangular cross section. A heat resistant alloy that can maintain a mechanical strength on the heat treatment, such as a nickel alloy, an iron alloy and an iron-nickel alloy, can be used as the metallic tube 2. In order to facilitate the fixture lightweight, the metallic tube 2 preferably has a cylindrical structure. In order to make easy the winding operation on a cylindrical fixture, the metallic tube may be a flexible tube having a bellows structure.

A stainless steel tube is preferred, since it does not stick with the metallic sheath comprising silver or silver alloy used often for an oxide superconducting sheath wire under the atmosphere of heat treatment.

The metallic sheath wire is inserted into the metallic tube to prevent it from contact with the metallic sheath wire each other.

Figure 2:
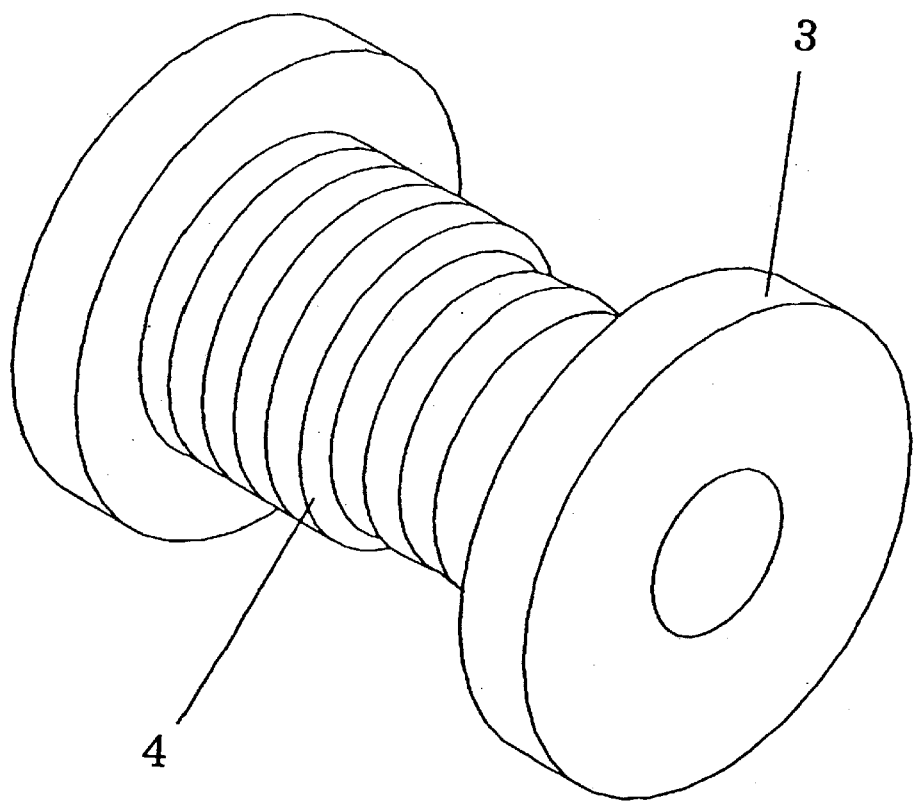
FIG. 2 is a perspective view showing a metallic tube, into which a metallic sheath wire is inserted, wound to overlap a cylindrical fixture.

FIG. 2 is a perspective view showing the metallic tube 4, into which the metallic sheath wire has been inserted, and wound to overlap a cylindrical fixture 3. By providing a space inside the metallic tube, in which the metallic sheath wire is not restricted by the metallic tube, the metallic sheath wire can freely move in the metallic tube without restriction, even at the part forming a step where the metallic tube runs up to an upper layer from a lower layer when the metallic tube is wound to overlap the cylindrical fixture. Thus, the metallic sheath wire does not suffer partial curvature or distortion, and the metallic tube 4, into which the metallic sheath wire has been inserted, can be wound by plural layers. Therefore, when heat treatment is conducted, the metallic sheath wire does not suffer any deformation, such as curvature.

Figure 3:
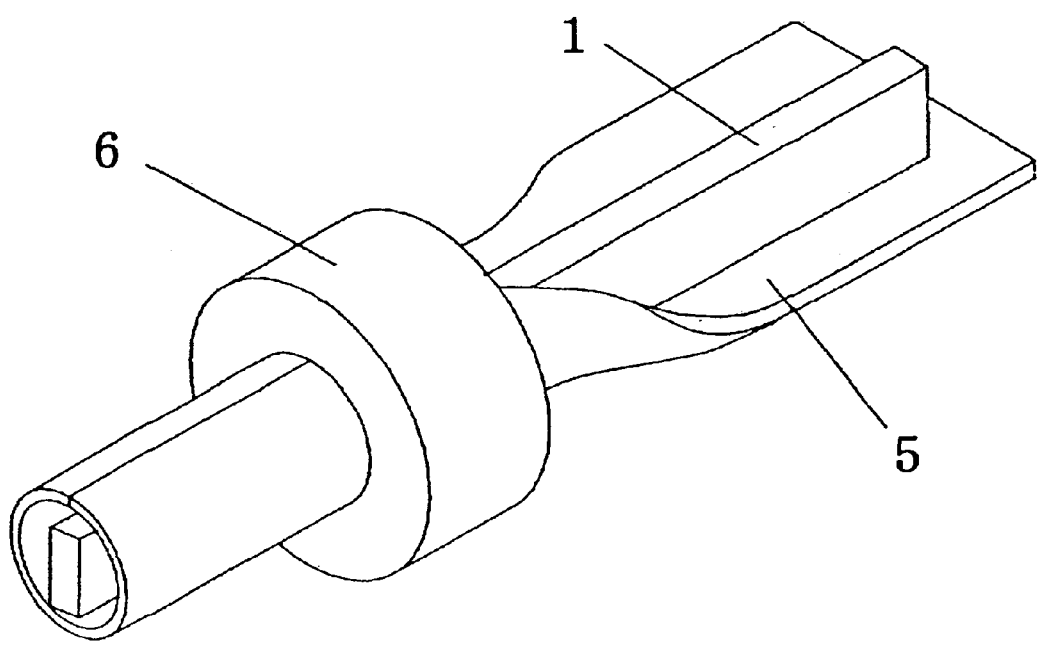
FIG. 3 is a perspective view showing, as a method for practicing the first invention, a state in which a metallic plate is subjected to deformation processing into a metallic tube by using a die, and a metallic sheath wire is simultaneously inserted into the metallic tube.

FIG. 3 is a perspective view showing the state in which a metallic plate 5 is subjected to deformation processing into a metallic tube using a die 6, and a metallic sheath wire 1 is simultaneously inserted into the metallic tube. In order to increase the single wire length, a metallic plate 5, such as a stainless steel tape, is subjected to deformation processing into a metallic tube having an inner diameter larger than the outer diameter or the width of the metallic sheath wire 1 by using a die or a roll, and the metallic sheath wire 1 is simultaneously inserted into the metallic tube, whereby the long length metallic sheath wire can be inserted into the metallic tube. Thereafter, the metallic tube, into which the metallic sheath wire has been inserted, is wound to overlap a cylindrical fixture, followed by subjecting it to heat treatment, and thus the long length superconducting wire can be produced.

While the basic concept of the first invention has been described with reference to the drawings, the first invention will be further described in detail with reference to specific embodiments.

While not shown in the figures, a plurality of the metallic sheath wires may be inserted into a metallic tube, so as to increase the amount of the metallic sheath wire that can be simultaneously subjected to heat treatment. In this case, when the metallic sheath wires are in contact with each other, there are cases where the metallic sheath wires stick together depending on the temperature and the atmosphere during heat treatment. Therefore, the plural metallic sheath wires are separated by a spacer and inserted into the metallic tube, so as to simultaneously subject the plural metallic sheath wires to heat treatment. In the case of the metallic sheath wire using silver as a sheath material, the metallic sheath wires can be prevented from sticking together by means such that: a sheet comprising alumina fibers or oxide powder, such as magnesia, and an organic binder is inserted as the spacer between the metallic sheath wires; a ceramic sheet is wound on the surface of the metallic sheath wire; or oxide powder, such as alumina or magnesia, is coated on the surface of the metallic sheath wire. The organic binder is evaporated during heat treatment, and the heat resistant fiber or the oxide powder remaining after the heat treatment does not react with the metallic sheath. Therefore, the metallic sheath wires can easily be separated from each other after heat treatment, and thus the long length oxide superconducting wire can be obtained.

A sheet comprising at least a heat resistant fiber or oxide powder and an organic binder can be used as the spacer, and alumina fibers are preferably used as the heat resistant fiber.

In the case of an oxide superconducting material, the superconducting characteristics, such as the critical temperature (Tc) and the critical electric current density (Jc), can be improved by controlling the atmosphere of heat treatment.

After filling an oxide superconducting material or raw material powder thereof in a metallic sheath and making the same into a metallic sheath wire, the metallic sheath wire is inserted into a metallic tube having an inner diameter larger than the outer diameter of the width of the metallic sheath wire, and the metallic sheath wire is subjected to heat treatment in a state in which the metallic sheath wire inserted into the metallic tube is wound to overlap a cylindrical fixture. In this case, a first heat treatment is conducted in air at a heat treatment temperature of from 840 to 850° C. to form an oxide superconducting phase, and after removal from the metallic tube and conducting deformation processing, a second heat treatment is conducted in a similar state as in the first heat treatment in that the metallic sheath wire inserted into the metallic tube is wound to overlap a cylindrical fixture, and at a temperature lower than the heat treatment temperature of the first heat treatment, whereby the binding property and the crystal orientation of the oxide superconducting material are improved, so as to produce the long length superconducting wire having a high critical electric current density.

In the invention, the metallic tube, into which the metallic sheath wire is inserted, can be used as a pressure vessel on the heat treatment of the metallic sheath wire. By replacing air inside the metallic tube with a nitrogen and oxygen mixing gas, sealing the metallic tube after then and conducting heat treatment with controlling the oxygen partial pressure, the long length metallic sheath wire can be heat treated uniformly in a small area. When a metallic sheath wire using an oxide superconducting material or raw material powder thereof is inserted into a metallic tube, which is wound to overlap a cylindrical fixture in a state where the metallic sheath wire has been inserted into the metallic tube, the first heat treatment is conducted at an oxygen partial pressure of 0.2 atm or less and a heat treatment temperature of from 830 to 840° C. to form an oxide superconducting phase, and after removal from the metallic tube and conducting deformation processing of the metallic sheath wire, the second heat treatment is conducted at a temperature lower than the heat treatment temperature of the first heat treatment in a similar state as in the first heat treatment in that the metallic sheath wire inserted into the metallic tube is wound to overlap the cylindrical fixture, whereby the binding property and the crystal orientation of the oxide superconducting material are improved, so as to produce the long length superconducting wire having a high critical electric current density.

In the case where a metallic sheath wire using the powder of an oxide superconducting material or raw material powder thereof is subjected to heat treatment, a gas may be formed from a reaction of the powder of the oxide superconducting material or raw material powder thereof or an adsorbed substance, so that a phenomenon that blisters occur at the metallic sheath part of the metallic sheath wire may be observed. In the process for producing a superconducting wire according to the invention, on the other hand, the metallic tube, into which the metallic sheath wire is inserted, is used as a pressure vessel, and the atmosphere inside the metallic tube is controlled to a vacuum, whereby the gas is easily evacuated to the outside of the metallic sheath wire, so as to produce the long length superconducting wire.

Furthermore, when a metallic sheath wire using an oxide superconducting material or raw material powder thereof is inserted into a metallic tube and subjected to heat treatment in a state where the metallic sheath wire inserted into the metallic tube is wound to overlap a cylindrical fixture, defects, such as blisters of the metallic sheath part, on the production of the superconducting wire can be reduced by conducting heat treatment with maintaining a vacuum inside of the metallic tube, so as to produce the long length superconducting wire. The vacuum herein is preferably $2.5 \times 10^2$ Pa or less.

The second invention is described below.

The second invention is basically the process comprising a step of conducting a treatment of two or more stacked pancakes each comprising a metallic sheath wire wound in a form of a coil by using a separating means that substantially does not restrict the behavior of the metallic sheath wire for stacking the two or more pancakes in such a manner that the adjacent pancakes are not in contact with each other. The second invention will be described in detail with reference to the figures and specific embodiments.

(1) Separating Means

Figure 4:
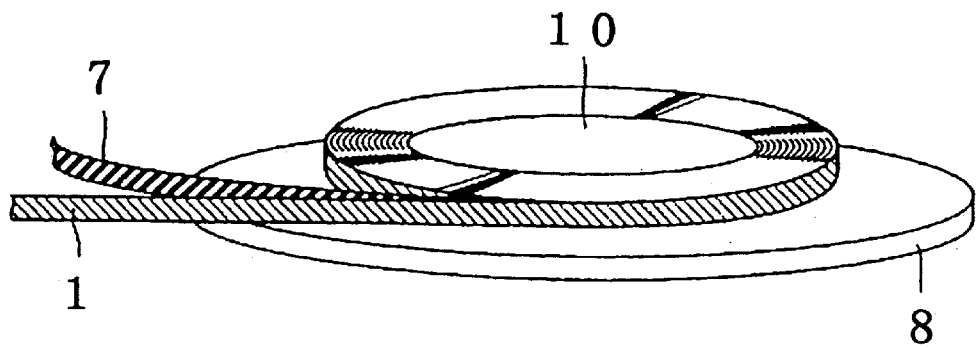
FIG. 4 is an explanatory view showing the step of winding a metallic sheath wire and a protective tape overlapping into a pancake form with the conventional technique relating to the second invention.
Figure 5:
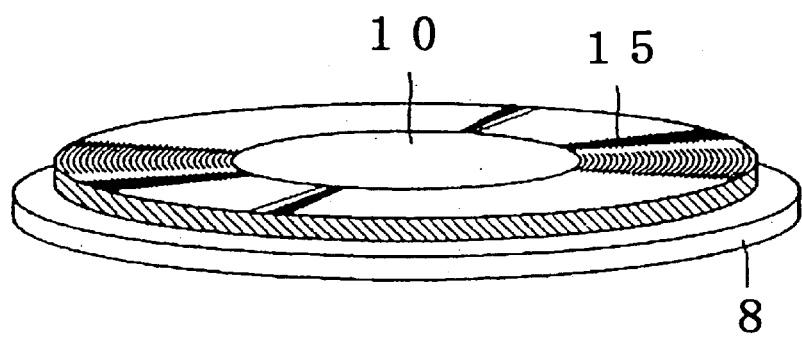
FIG. 5 is an explanatory view showing the state in which a metallic sheath wire wound in a pancake form is placed on a flat plate in a conventional technique relating to the second invention.
Figure 6:
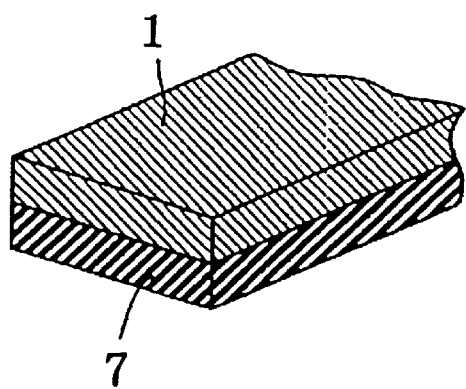
FIG. 6 is a schematic view showing the state in which a metallic sheath wire and a protective tape are stacked relating to the second invention.

FIGS. 4 and 5 are explanatory views showing the state in which a metallic sheath wire 1 and a protective tape 7 overlap each other in the conventional technique relating to the second invention. FIG. 4 shows a step during the formation of a pancake where the metallic sheath wire 1 and the overlapped protective tape 7 are wound on a core 10, and FIG. 5 shows a state where the pancake 15 has been formed. FIG. 6 shows a state in which the metallic sheath wire 1 and a ceramic sheet 7 are overlapped for making the pancake shown in FIG. 4 or 5.

Figure 7:
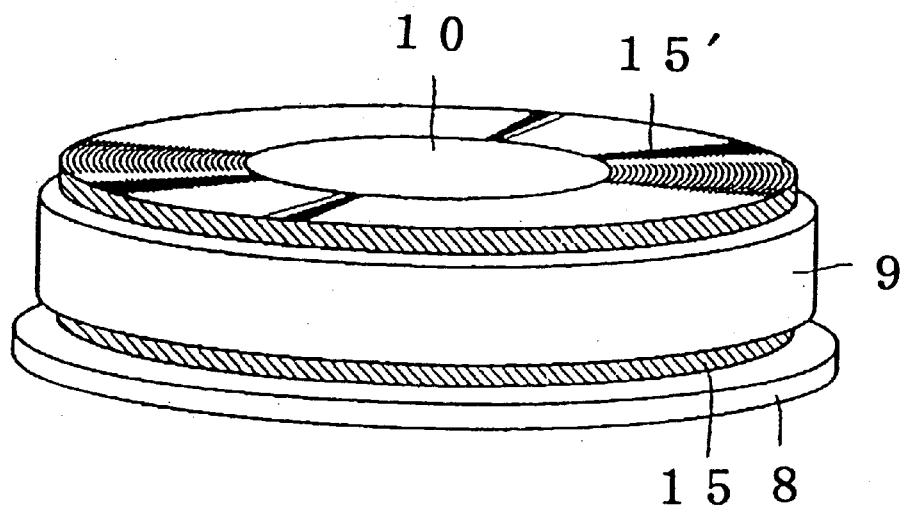
FIG. 7 is a schematic view showing the state in which two pancakes are stacked in Examples 7-1 to 7-3 of the second invention.

FIG. 7 is a schematic view showing an example of a first embodiment that can be applied to the second invention, in which a state in that a ceramic board 9 as a protective layer is placed on a first pancake 15 is shown. The ceramic board 9 has a center hole, and when the ceramic board 9 is placed, the core 10 is inserted in the center hole to protrude from the upper side by penetrating the ceramic board 9. A second pancake 15' is placed onto the ceramic board 9 formed by the same way of the first pancake 15. The ceramic board 9 inserted between the pancakes 15 and 15' is a separating and multiplying means for stacking two or more pancakes preventing the pancakes from sticking each other. As an effect of the first embodiment, the ceramic board 9 used as a retainer itself functions as a protective layer, which is the separating and multiplying means. By making the ceramic board 9 itself intervening between the pancakes 15 and 15', the vertically stacked pancakes can be retained as being separated from each other as shown in FIG. 7.

Figure 8:
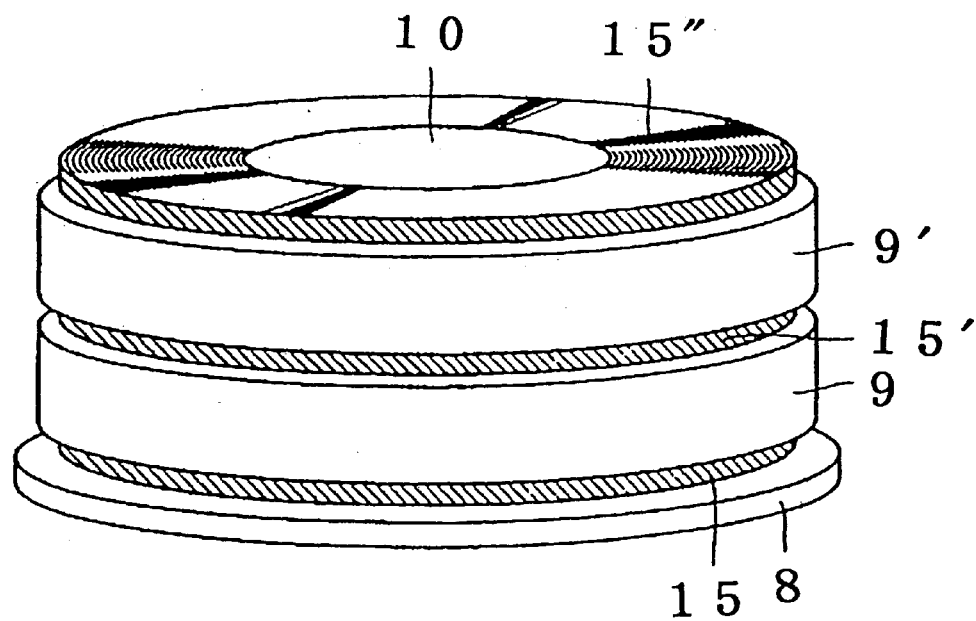
FIG. 8 is a schematic view showing the state in which three or more pancakes are stacked in Examples 7-1 to 7-3 of the second invention.

FIG. 8 shows that according to the second invention, three or more pancakes can be stacked. As shown in FIG. 8 three pancakes, 15, 15' and 15" are stacked separating with two ceramic boards 9 and 9'.

Figure 9:
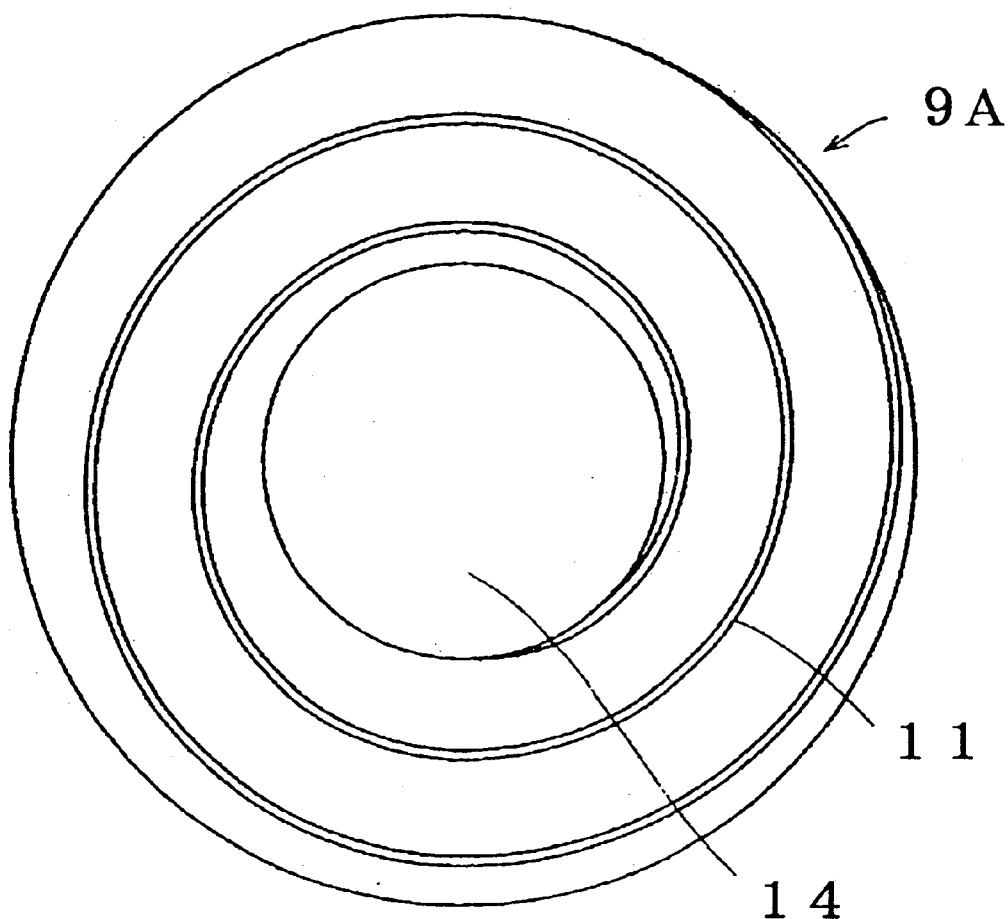
FIG. 9 is a plan view showing an example of a ceramics board as a retainer in the second embodiment of the second invention.

FIG. 9 shows a ceramic board 9 as a second embodiment that can be applied to the second invention. The ceramic board 9A is a round disk having at the center thereof a center hole 14, into which a core is penetrated. As means for making the metallic sheath wire continuous, a spiral groove 11 is provided on the upper surface in order to pass the metallic sheath wire substantially without restriction. One end of the spiral groove 11 is in contact with and connected to the outer periphery and the other end in contact with and connected to the inner periphery. As an effect of the second embodiment, because the continuous metallic sheath wire from the pancake 15 of the lower step is guided to the upper step through the spiral groove 11, the metallic sheath wire can again be wound to a pancake form in the upper step. The metallic sheath wire 1 is not restricted in the range inside the groove provided has sufficient width and depth, and therefore the metallic sheath wire 1 can be continuous without termination to another step, i.e., a ceramic board 9 of an upper step, substantially without restriction.

While the case where the metallic sheath wire is continuous from the lower step to the upper step is described in this embodiment, the same can be applied to the case where the metallic sheath wire is continuous from the upper step to the lower step. While the mode of stacking the pancakes 15, 15' and 15" is described for the case where they are vertically stacked, they may be stacked horizontally. By employing the constitution described in the foregoing, the end of the metallic sheath wire wound on one pancake can be easily guided to another pancake by arranging the metallic sheath wire inside the spiral groove.

Figure 10:
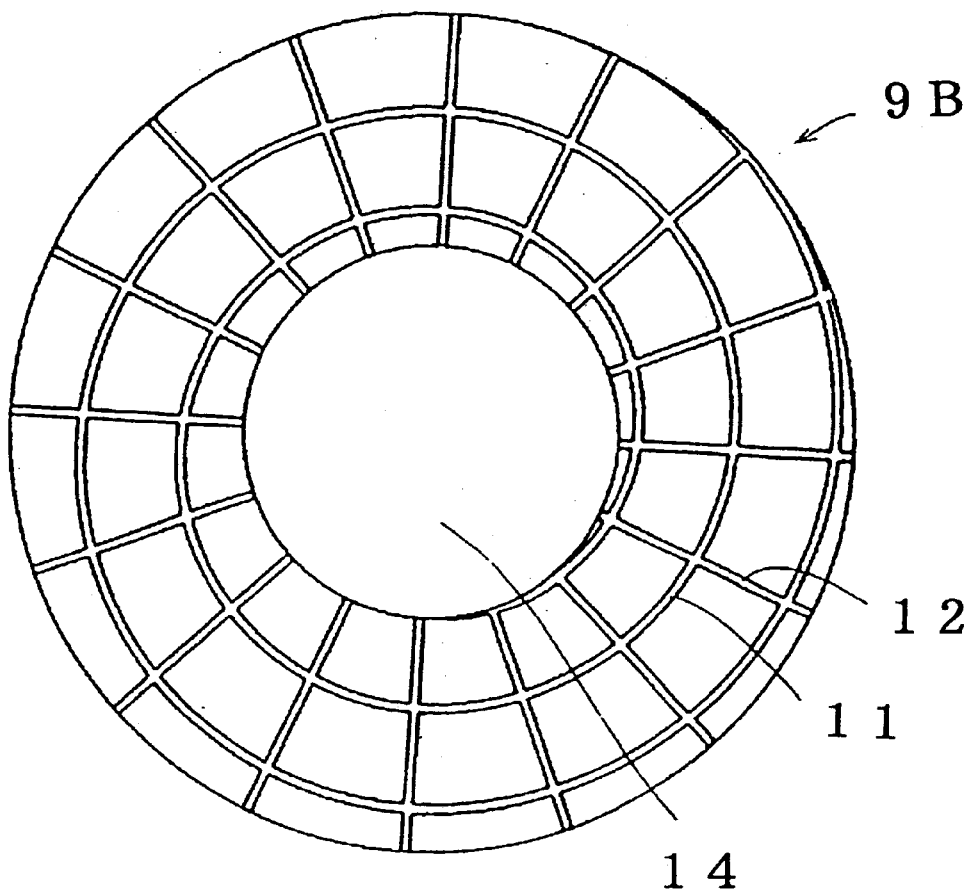
FIG. 10 is a plan view showing an example of a ceramic board as a retainer in the third embodiment of the second invention.
Figure 11:
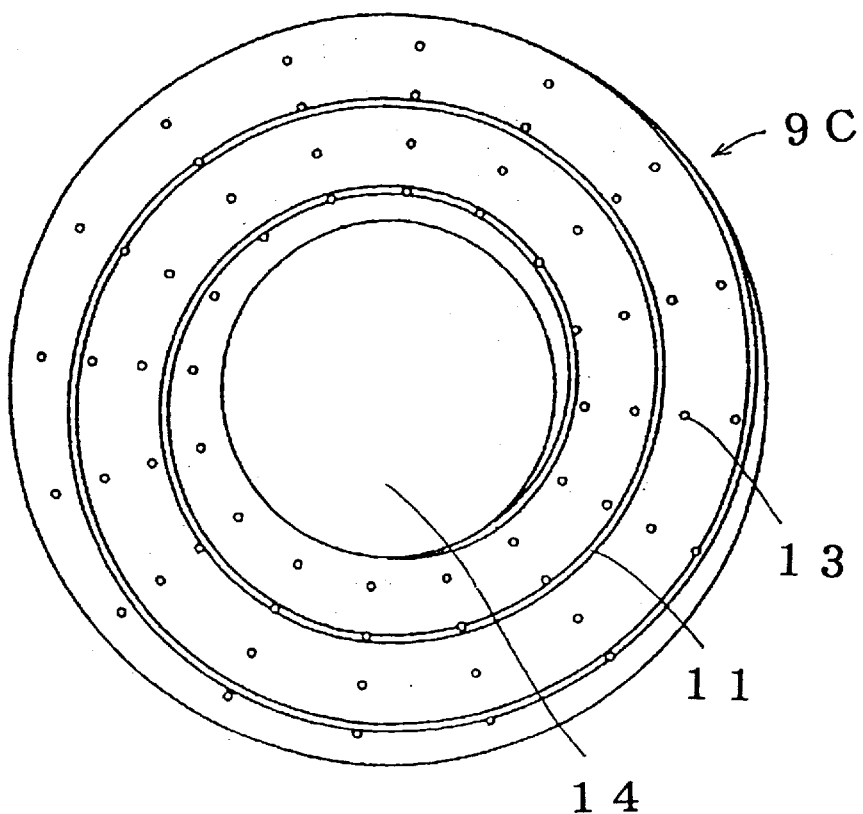
FIG. 11 is a plan view showing another example of a ceramic board as a retainer in the third embodiment of the second invention.
Figure 12:
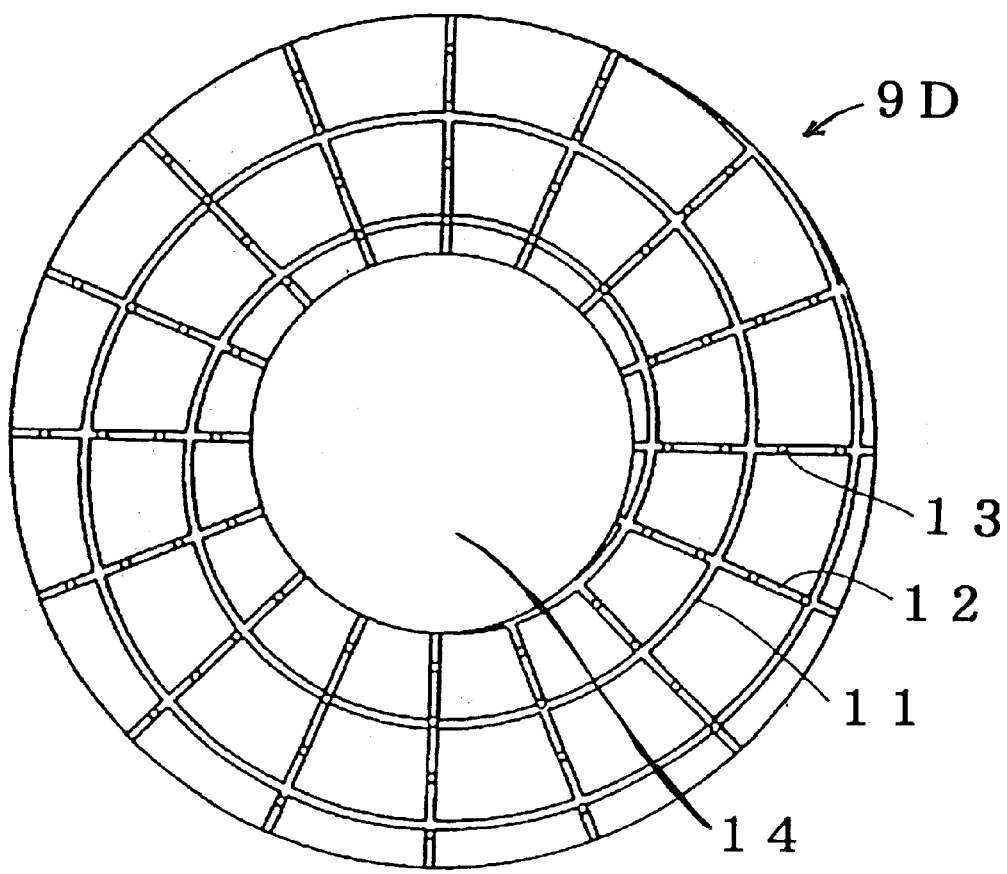
FIG. 12 is a plan view showing a further example of a ceramic board as a retainer in the third embodiment of the second invention.

FIGS. 10 to 12 show ceramic boards 9B, 9C and 9D, which are examples of a third embodiment that can be applied to the second invention. The three types of ceramic boards 9B, 9C and 9D each have, as gas stream flattening means for making the gas stream uniform, radial grooves 12 in FIG. 10, holes 13 radially arranged in FIG. 11, and radial groove 12 each having holes 13 in FIG. 12. As an effect of the third embodiment, a uniform treatment can be conducted by employing the constitution described in the foregoing to resolve the problem of the difference in gas stream that occurs depending on the part where the pancakes occupy and the parts inside the pancake due to geometrical conditions on stacking the pancakes. The gas stream flattening means comprises grooves or holes provided in the protective ceramic boards 9B, 9C and 9D.

(2) Retainer

When a ceramic board 9 and a ceramic sheet 7 each mainly comprising fibers or powder not disappearing by heat treatment and a binder disappearing by heat treatment is used as one embodiment of the retainer as the separating means in the second invention, the binder disappears during heat treatment, and the ceramic board 9 and the ceramic sheet 7 are in a state where they are freely movable, so as to freely move along with the shrinkage and expansion of the metallic sheath wire 1 in contact. Therefore, because the metallic sheath wire 1 is not restricted by the ceramic sheet 7, deformation of the metallic sheath wire 1 can be prevented.

The heat resistant fiber or powder contained in the ceramic sheet 7 and the ceramic board 9 are formed with the organic binder. Examples of the heat resistant fiber or powder includes alumina fibers, alumina powder, magnesia powder, silica, manganese oxide and chromium oxide, and the ceramic sheet 7 may comprise at least fibers, such as alumina fibers, as a main component.

It has been confirmed that when the ceramic sheet 7 comprises at least fibers, such as alumina fibers, as a main component, the metallic sheath wires 1 adjacent to each other are not in contact with each other. In the case where the heat resistant fiber or powder is a mixture of fibers and powder, such as a mixture of alumina fibers and magnesia powder, and a mixture of alumina fibers and silica, the ceramic sheet is more easily peeled off from the metallic sheath wire than ceramic sheet containing fibers only, and thus the removal thereof can be easily conducted. It has also been found that when the ceramic board 9 comprises at least fibers, such as alumina fibers, as a main component, the ceramic board is not inadvertently broken.

(3) Heat Treatment Method

Another aspect of the second invention is a superconducting wire comprising the metallic sheath wire that is produced by a step of filling a metallic sheath with powder of an oxide superconducting material or raw material powder thereof and a step of conducting deformation processing.

As has been described for the first invention, the conditions of heat treatment are an important factor in the production process containing heat treatment.

That is, in the aspect of the first embodiment of the production process comprising heat treatment according to the second invention, heat treatment is preferably conducted at a temperature of from 840 to 850° C.

In the aspect of the second embodiment of the production process comprising heat treatment according to the invention, heat treatment preferably comprises the first heat treatment to be conducted at a temperature of from 840 to 850° C. and the second heat treatment conducted at a temperature that is lower than that of the first heat treatment by 5° C.

In the aspect of the third embodiment of the production process comprising heat treatment according to the invention, heat treatment is preferably conducted in an atmosphere having an oxygen partial pressure of from 0.01 to 0.2 atm.

The first invention will be described in more detail with reference to Examples 1 to 6 and Comparative Examples 1 and 2, and the second invention will be described in more detail with reference to Examples 7 to 12.

EXAMPLE 1

An Nb sheet having a thickness of 0.2 mm and an Al sheet having a thickness of 0.5 mm were stacked and wound plurally on a copper round bar having an outer diameter of 6 mm, so as to form a complex material, which was then inserted in a copper tube having a diameter of 25.5 mm and an inner diameter of 22 mm, and subjected to wire drawing to a diameter of 2 mm and shaping to a hexagonal cross section. A cluster of plural metallic complexed materials having been shaped to have a hexagonal cross section was inserted into a copper tube having a diameter of 25.5 mm and an inner diameter of 22 mm, and was further subjected to wire drawing, so as to produce a metallic sheath wire having a diameter of 1.5 mm, which was formed by complexing a multi-filament of Nb and Al, and copper. The metallic sheath wire was inserted into a stainless steel tube (outer diameter: 4 mm, inner diameter: 3 mm), and wound to overlap a stainless steel cylindrical fixture having a diameter of 280 mm. Thereafter, the stainless steel cylindrical fixture was placed in a heating furnace, and heat treatment was conducted in air at a heat treatment temperature of 840° C. for 50 hours. After the heat treatment, the metallic sheath wire was removed from the stainless steel tube, and deformation, such as partial curvature, was not found in the metallic sheath wire, so as to obtain a long length $Nb_3Al$ superconducting wire.

EXAMPLE 2

A powder mixture of $Bi_2O_3$, PbO, $SrCO_3$, $CaCO_3$ and CuO at a weight ratio of 0.36/0.055/0.23/0.15/0.2 was subjected to heat treatment at 800° C. for 12 hours and then further subjected to heat treatment at 850° C. for 6 hours. After pulverizing an oxide body thus sintered by the heat treatments, the resulting powder was filled into a silver tube having an outer diameter of 25.5 mm and an inner diameter of 22 mm. The silver tube was subjected to wire drawing and rolling, and further repeatedly subjected to wire drawing and clustering-rolling, so as to produce a tape-shaped metallic sheath wire having a multi-filament of 61 cores (width: 3.5 mm, thickness: 0.25 mm).

The tape-shaped sheath wire was inserted into a stainless steel tube (outer diameter: 6 mm, inner diameter: 5 mm), and wound to overlap a stainless steel cylindrical fixture having a diameter of 280 mm. Thereafter, the stainless steel cylindrical fixture was placed in a heating furnace, and a first heat treatment was conducted in air at a heat treatment temperature of 840° C. for 50 hours. After the heat treatment, the metallic sheath wire was removed from the stainless steel tube, and deformation, such as partial curvature, was not found in the metallic sheath wire. The metallic sheath wire was further subjected to rolling to obtain a tape-shaped metallic sheath wire having a length of 3 km (width: 4 mm, thickness: 0.22 mm), which was inserted into a stainless tube in the same manner as in the first heat treatment, and then subjected to a second heat treatment at 835° C., which is a lower heat treatment temperature than that of the first heat treatment by 5° C. Furthermore, heat treatments were conducted at a heat treatment temperature of the first heat treatment varying an interval of 5° C. from 835 to 855° C., and the same rolling treatment of the metallic sheath wire and the second heat treatment at a heat treatment temperature lower than that of the first heat treatment by 5° C. were conducted, so as to obtain superconducting wires. The critical electric current densities at the temperature of liquid nitrogen of the resulting superconducting wires were measured, and they were found to be 0.8 $kA/cm^2$ for the first heat treatment temperature of 835° C., 1.8 $kA/cm^2$ for 840° C., 2.2 $kA/cm^2$ for 845° C., 2.5 $kA/cm^2$ for 850° C. and 1.2 $kA/cm^2$ for 855° C. Thus, a long length superconducting wire having a high critical electric current density could be obtained in the range of heat treatment temperature of from 840 to 850° C.

COMPARATIVE EXAMPLE 1

The same tape-shaped metallic sheath wire having a multi-filament before the heat treatment as in Example 2 was directly wound to overlap the stainless steel cylindrical fixture, and placed in a heat treatment furnace to similarly conduct heat treatment at a heat treatment temperature of 840° C. for 50 hours. In order to prevent the tape-shaped metallic sheath wires from contact with each other, a sheet comprising alumina fiber and an organic binder was inserted between the metallic sheath wires, followed by subjecting them to the heat treatment. After the heat treatment, sticking of the metallic sheath wire was not found. However, the tape-shaped metallic sheath wire was deformed at the part forming a step where the tape-shaped metallic sheath wire runs up to an upper layer from a lower layer, and a long length superconducting wire required for producing a superconducting magnet could not be produced.

COMPARATIVE EXAMPLE 2

A superconducting wire was produced in the same manner as in Example 2 where the first heat treatment temperature was 850° C. and the second heat treatment temperature was 845° C., and was divided into superconducting wires each having a single wire length of 100 m and superconducting wires each having a length of 1 km. By using the superconducting wires, two kinds of superconducting wires having a length of 3 km were produced by connecting with solder, one of which was obtained from thirty 100-m superconducting wires, and the other of which was obtained from three 1-km superconducting wires. The resistance at the respective connecting parts was from $10^{-6}$ to $10^{-7}$ Ω at the temperature of liquid nitrogen. When an electric current of 300 A was applied, heat of from 9 to 90 mW was formed from the connecting part. As a result of comparison between the critical electric current density (Jc) of the superconducting wire produced in Example 2 and the superconducting wire produced in Comparative Example 2, the oxide superconducting wire having a single wire length of 3 km had a Jc of 2.5 $kA/cm^2$, whereas the superconducting wire composed of thirty 100-m superconducting wires had a Jc of 0.8 kA/cm², which was about half of that of the oxide superconducting wire having a single wire length of 3 km, and the superconducting wire composed of three 1-km superconducting wires had a Jc of 1.2 kA/cm², which was lower than the oxide superconducting wire having a single wire length of 3 km. It was thus found that to increase the length solely by connecting short superconducting wires was insufficient for producing a superconducting magnet requiring a long length superconducting wire having a high critical electric current density due to formation of a high magnetic field.

EXAMPLE 3

The same tape-shaped metallic sheath wire having a multi-filament before the heat treatment as in Example 2 was cut to obtain a superconducting wire each having a single wire length of 2 km. Five 2-km superconducting wires were inserted into a stainless steel tube where the superconducting wires were separated by a separator comprising alumina fibers and an organic binder to prevent contact with each other, and the stainless steel tube was wound to overlap a stainless steel cylindrical fixture having a diameter of 280 mm, which was then subjected to a first heat treatment in air at a heat treatment temperature of 850° C. for 50 hours. The metallic sheath wires were removed from the stainless steel tube, and subjected to rolling to obtain a tape-shaped metallic sheath wire (width: 4 mm, thickness: 0.22 mm). Similar to the first heat treatment, the tape-shaped metallic sheath wires were inserted in a stainless steel tube, and then subjected to a second heat treatment at a heat treatment temperature of 845° C. The tape-shaped superconducting wires obtained by the heat treatments were removed and observed as to whether or not curvature was formed in the metallic sheath wires. As a result, no partial curvature was not found in any of the metallic sheath wires, so as to obtain a long length superconducting wire, the critical electric current density (Jc) of which was 2.4 kA/cm².

The heat treatment of the oxide superconducting wires was conducted in the same manner as the foregoing except that the heat resistant fiber or powder of the spacer was changed to alumina fibers, alumina powder, magnesia powder, silica, manganese oxide and chromium oxide. As a result of the observing the adhering conditions of the spacer between the oxide superconducting wires with the naked eye, it was confirmed that while all the materials could be used as the spacer, alumina fibers were excellent as the spacer from the standpoint of the peeling property of the metallic sheath wires and uniformity.

EXAMPLE 4

The same tape-shaped metallic sheath wire having a multi-filament before the heat treatment as in Example 2 was cut to obtain superconducting wires each having a single wire length of 4 km. A stainless steel tape having a width of 20 mm, a thickness of 0.5 mm and a length of 4 km was passed through a die having a die hole diameter of 6 mm, whereby a stainless steel tube having an outer diameter of about 6 mm was formed, and simultaneously the metallic sheath wire was inserted into the stainless steel tube, as shown in FIG. 3. The tape-shaped metallic sheath wire was loosely inserted into the stainless steel tube having an outer diameter of about 6 mm. The metallic tube, into which the metallic sheath wire had been inserted, was wound to overlap a stainless steel cylindrical fixture having a diameter of 280 mm, and was subjected to a first heat treatment in air at a heat treatment temperature of 850° C. for 50 hours. Thereafter, similar to Example 2, rolling and the second heat treatment at a heat treatment temperature of 845° C. were conducted to produce a superconducting wire. The resulting superconducting wire was removed and observed as to whether or not curvature was formed in the metallic sheath wires. As a result, no partial curvature was not found in the superconducting wire, so as to obtain a long length superconducting wire.

EXAMPLE 5

The same metallic sheath wire having a multi-filament before the heat treatment as in Example 2 was inserted into a stainless steel tube, and then the atmosphere inside the stainless steel tube was replaced from air to an oxygen and nitrogen mixing gas with an oxygen partial pressure of 0.2 atm or less, followed by sealing the metallic sheath wire in the stainless steel tube. Specifically, the atmosphere inside the stainless steel tube was replaced with a mixed gas having an oxygen partial pressure of 0.08 atm, and the metallic sheath wire was sealed in the stainless steel tube. The metallic tube was wound on a cylindrical fixture, and a first heat treatment was conducted at 835° C. for 50 hours. Thereafter, the metallic tube was cooled in air, and the oxide superconducting wire was removed from the stainless tube, which was subjected to rolling and a second heat treatment in air at 830° C. The resulting superconducting wire was measured for the critical electric current density (Jc) at the temperature of liquid nitrogen. The Jc was 3.0 kA/cm², which was higher than the Jc in Example 2 of 0.8 kA/cm², and thus an increase in Jc could be obtained by controlling the oxygen partial pressure to 0.2 atm or less.

Furthermore, heat treatments were conducted at a heat treatment temperature of the first heat treatment varying an interval of 5° C. from 825 to 845° C., and the same rolling treatment and the second heat treatment at a heat treatment temperature lower than that of the first heat treatment by 5° C. were conducted, so as to obtain superconducting wires. The Jcs at the temperature of liquid nitrogen of the resulting superconducting wires were measured and found to be 1.1 kA/cm² for the first heat treatment temperature of 825° C., 2.8 kA/cm² for 830° C., 2.5 kA/cm² for 840° C. and 1.5 kA/cm² for 845° C. Thus, a long length superconducting wire having a high critical electric current density could be obtained in the range of the first heat treatment temperature of from 830 to 840° C.

EXAMPLE 6

In the case of producing an oxide superconducting wire, there are cases where a metallic sheath part locally blisters in the step of the heat treatment of the metallic sheath wire, whereby it is largely deformed. A cause of the blister of the metallic sheath part is considered to be due to heat expansion of a gas inside the metallic sheath wire. The critical electric current density (Jc) is decreased at the part where the blister of the metallic sheath wire occurs. In the case where the blister of the metallic sheath wire occurs due to heat expansion of the gas, such as $CO_2$, $H_2O$ and $O_2$, a method of conducting the heat treatment in vacuum can be considered for the prevention of the blister of the metallic sheath part. In this example, accordingly, after inserting the same metallic sheath wires having a multi-filament before the heat treatment as in Example 2 into a stainless steel tube, they were sealed under the condition that the pressure inside the metallic tube was $1 \times 10^5$ Pa, $5 \times 10^3$ Pa, $2.5 \times 10^2$ Pa, 2.5 Pa and $5 \times 10^{-2}$ Pa, and were subjected to heat treatment at 850° C. for 50 hours. After the heat treatment, the blister of the wire was evaluated with the naked eye, and the numbers of blisters per 1 m were found to be 7, 5, 0.8, 0.3 and 0.1, respectively. Thus, in the production of an oxide superconducting wire, the blisters of the metallic sheath part could be suppressed by controlling the degree of vacuum on the heat treatment of the metallic sheath wire, so as to obtain a long length superconducting wire.

EXAMPLE 7-1

Production Process

A powder mixture of $Bi_2O_3$, PbO, $SrCO_3$, $CaCO_3$ and CuO at a weight ratio of 0.36/0.055/0.23/0.15/0.2 was prepared. The powder mixture was subjected to heat treatment at 800° C. for 12 hours and then further subjected to heat treatment at 850° C. for 6 hours, so as to obtain a sintered oxide. The sintered oxide was pulverized to obtain powder. The powder was filled into a metallic tube comprising silver as a metallic sheath having an outer diameter of 36 mm and inner diameter of 30 mm. The metallic tube comprising silver was subjected to wire drawing and rolling to produce a multi-filament tape-shaped metallic sheath wire of 61 cores having a length of 1 km, a width of 3.5 mm and a thickness of 0.25 mm. Two of the same metallic sheath wires were produced.

The multi-filament tape-shaped metallic sheath wire 1 as the metallic sheath wire, i.e., a superconducting wire, was stacked with a commercially available ceramic sheet 7, and was wound into a pancake form around a core 10 protruding from an upper surface of a flat plate 8 as a sintering fixture, so as to produce a first pancake 15. The ceramic sheet 7 used comprised alumina fibers as a main component and had a thickness of 0.2 mm.

As shown in FIG. 7, a ceramic board 9 having a thickness of 10 mm formed with alumina fibers and an organic binder as a protective layer was placed on the first pancake 15. The ceramic board 9 has a center hole 14. Before placing a second pancake 15' on the ceramic board 9, a core 10 was inserted into the center hole 14 of the ceramic board 9, and the core 10 penetrated the ceramic board 9 and protruded from the upper surface thereof. Another metallic sheath wire 1 was wound in a pancake form on the protruded core 10 from the upper side together with a ceramic sheet 7 in the same manner as in the first pancake 15, so as to form a second pancake 15'.

The assembly containing two pancakes 15 and 15' was subjected to heat treatment in which the temperature was increased to 800° C. over 3 hours and then increased to 840° C. over 2 hours, which was maintained at a first temperature of 840° C. for 50 hours.

After the thickness of the metallic sheath wire was decreased by 10% by rolling, it was subjected to heat treatment in which the temperature was increased to 800° C. over 3 hours and then increased to 835° C. over 2 hours, which was maintained at a second temperature of 835° C. for 50 hours. The temperature of 835° C. was selected as a temperature that was lower than 840° C. by 5° C.

Result

After the heat treatment, it was evaluated as to whether the remaining ceramic sheet 7 and ceramic board 9 tended to peel off from the metallic sheath wire 1, and also it was observed by the naked eye as to whether or not there was a part where the adjacent metallic sheath wires were in contact with each other. As a result, problems were confirmed to have occurred.

The metallic sheath wires were removed from the respective pancakes 15 and 15', and the remaining ceramic sheet 7 and ceramic board 9 were removed by peeling, so as to obtain a superconducting wire as a good heat-treated metallic sheath wire.

EXAMPLE 7-2

Production Process

Superconducting wires were produced as heat-treated metallic sheath wires by conducting heat treatment in the same manner as in Example 7-1 except that the alumina fibers, as the heat resistant fiber or powder contained in the ceramic sheet 7 and the ceramic board 9, were replaced by alumina powder, magnesia powder, silica, manganese oxide and chromium oxide, respectively.

Result

It was confirmed that in the case where the ceramic sheet 7 comprised at least fibers, such as alumina fibers, as a main component, the adjacent metallic sheath wires 1 were not in contact with each other.

In the case where the heat resistant fiber or powder was a mixture of fibers and powder, such as a mixture of alumina fiber and magnesia powder, and a mixture of alumina fibers and silica, it was found that the ceramic sheet could be more easily peeled off from the metallic sheath wire 1 than a ceramic sheet containing only fibers, therefore it could be easily removed.

It was also found that when the ceramic board 9 comprised at least fibers, such as alumina fibers, as a main component, the ceramic board was not inadvertently broken.

EXAMPLE 7-3

Production Process

While the first temperature was 840° C. and the second temperature was 835° C. in Example 7-1, the heat treatment in this example was conducted at the first temperature varying an interval of 5° C. from 835 to 855° C. The second temperature in the heat treatment of this example was lower than the first temperature by 5° C. Thus, superconducting wires as heat-treated metallic sheath wires were obtained.

Result

As a result, the resulting metallic sheath wires 1 were evaluated for their relationship between the respective first temperatures and the critical electric current densities at the temperature of liquid nitrogen, which was found to be as follows:

| | |
|---|---|
| 835° C. | 0.8 kA/cm$^2$ |
| 840° C. | 1.8 kA/cm$^2$ |
| 845° C. | 2.2 kA/cm$^2$ |
| 850° C. | 2.5 kA/cm$^2$ |
| 855° C. | 1.2 kA/cm$^2$ |

Thus, it was found that high critical electric current densities could be obtained at the first temperature of from 840 to 850° C.

EXAMPLE 8-1

Constitution of Retainer

A ceramic board 9 shown in FIG. 9 was used in Examples 8-1 to 8-3.

Production Process

Powder having a compositional ratio Bi/Pb/Sr/Ca/Cu= 1.82/0.33/1.92/2.03/3.01 was prepared by mixing powder of $Bi_2O_3$, PbO, $SrCO_3$, $CaCO_3$ and CuO. The resulting powder was subjected to heat treatment at 750° C. for 10 hours and then subjected to heat treatment at 800° C. for 8 hours. The resulting sintered body was pulverized in an automortar. The powder obtained by pulverization was subjected to heat treatment at 850° C. for 4 hours, and then the sintered body again obtained was pulverized in an automortar. The resulting powder was subjected to heat treatment at 800° C. for deaeration. The resulting powder was filled into a metallic tube comprising silver as a metallic sheath having an outer diameter of 60 mm and an inner diameter of 55 mm. The metallic tube comprising silver was subjected to wire drawing and rolling to produce a multi-filament tape-shaped metallic sheath wire of 61 cores having a length of 2 km, a width of 4.0 mm and a thickness of 0.26 mm.

The multi-filament tape-shaped wire as the metallic sheath wire, i.e., the metallic sheath wire 1, was stacked with a commercially available ceramic sheet 7 as a protective tape, and the first half of a length of 1 km thereof was wound on a core 10 in a pancake form, so as to produce a pancake 15.

The core 10 was inserted into a center hole 14 of a ceramic board 9A to penetrate the same, so as to set the ceramic board 9A as shown in FIG. 9 on the pancake 15. The ceramic board 9A had a spiral groove 11 as described in the foregoing.

The last half of 1 km of the metallic sheath wire 1 extended outside the outer periphery of the pancake 15 having been wound, and the last half was guided from one end of the spiral groove 11 at the outer periphery to the other end thereof at the inner periphery through the interior of the spiral groove 11. The last half of about 1 km of the metallic sheath wire 1 extending from the end of the spiral groove at the inner periphery was together with a ceramic sheet 7 wound on the core 10 on the upper surface of the ceramic board 9A. As a result, the assembly comprising two pancakes vertically stacked as shown in FIG. 7 was obtained.

The resulting assembly comprising two pancakes 15 and 15' was subjected to heat treatment in which the temperature was increased to 800° C. over 3 hours and then increased to 840° C. over 2 hours, which was maintained at a first temperature of 840° C. for 50 hours.

After the metallic sheath wire was unwound from the pancakes 15 and 15', and the thickness thereof was decreased by 10% by rolling, it was again wound similarly to a pancake form. The resulting pancakes were subjected to heat treatment in which the temperature was increased to 800° C. over 3 hours and then to 835° C. over 2 hours, which was maintained at a second temperature of 835° C. for 50 hours. The selected temperature of 835° C. was lower than 840° C. by 5° C.
Result Before the rolling and after the heat treatment at the second temperature, it was evaluated as to whether the remaining ceramic sheet 7 and ceramic board 9 tended to peel off from the metallic sheath wire 1. Furthermore, it was observed by the naked eye as to whether or not there was a part where the adjacent metallic sheath wires were in contact with each other. As a result, it was confirmed that no problem occurred.

After the heat treatment at the second temperature, the remaining ceramic sheet 7 and ceramic board 9 were removed by peeling, so as to obtain a superconducting wire as a good heat-treated metallic sheath wire.

EXAMPLE 8-2

While the ceramic board 9A in Example 8-1 comprised only alumina fibers as a main component, silica was added to a ceramic board in this example in addition to the alumina fibers to increase the strength. By using the ceramic board, heat treatment was conducted to produce a superconducting wire as a heat-treated metallic sheath wire. As a result, it was found that better superconductivity was obtained in the case where silica was added in addition to the alumina fibers.

EXAMPLE 8-3

While in Example 8-1, the metallic sheath wire 1 having a length of 2 km was produced and the heat treatment was conducted in the state where two pancakes were stacked, it was possible to stack three or more pancakes to be subjected to heat treatment as shown in FIG. 8.

In this example, a metallic sheath wire 1 having a length of 10 km was produced in the same manner, and heat treatment was conducted in which ten pancakes were stacked. In this case, heat treatment could be conducted without any problem of sticking or deformation of the metallic sheath wires by using the ceramic board 9A shown in FIG. 9, and thus a good superconducting wire could be obtained as a heat-treated metallic sheath wire.

EXAMPLE 9

Constitution of Retainer

Ten samples of superconducting wires were obtained in each of Examples 7-1 to 7-3 and Examples 8-1 to 8-3 where the two pancakes were stacked and subjected to heat treatment, and were evaluated for the critical electric current densities as the superconducting characteristics. As a result, it was found that, at a proportion of one superconducting wire per three samples, the metallic sheath wire 1 that had been the lower pancake 15 exhibited a lower critical electric density Jc than the other samples, although it met the standard.

Accordingly, the ceramic board 9 or 9A was provided with gas stream flattening means for making the gas stream uniform to produce three types of ceramic boards, i.e., radial grooves 12 in FIG. 10 for a ceramic board 9B, holes 13 radially arranged in FIG. 11 for a ceramic board 9C, and radial groove 12 each having holes 13 in FIG. 12 for a ceramic board 9D. The other constitutional components of the ceramic board 9 or 9A were the same as in the second embodiment.

The same heat treatments as in Examples 7-1 to 7-3 and Examples 8-1 to 8-3 were conducted by using the resulting ceramic boards to produce superconducting wires as the treated metallic sheath wires, which were then evaluated for critical electric current density Jc.
Result As a result, it was found that the superconductivity was stabilized in the case where the grooves or the holes were provided as in FIGS. 10 to 12 in comparison to the case where they were not provided.

EXAMPLE 10-1

Production Process

A superconducting wire was produced as a heat-treated metallic sheath wire in such a manner that a pancake 15 formed by winding in the same manner as in Examples 7-1 to 7-3 was subjected to heat treatment by maintaining a first temperature of 835° C. for 50 hours and then a second temperature of 830° C., which was lower than the first temperature by 5° C., for 50 hours, provided that the oxygen partial pressure of the atmosphere on the heat treatment was not 0.2 atm but was 0.08 atm by mixing oxygen and nitrogen supplied from containers thereof The other conditions are the same as those of Examples 7-1 to 7-3. After the heat treatment, the critical electric current density Jc was measured.
Result The critical electric current density Jc was 3.0 kA/cm$^2$, which was higher than the average value of 2.5 kA/cm$^2$ obtained by the heat treatment in Examples 7-1 to 7-3. It was found from the result that the critical electric current density Jc increased by reducing the oxygen partial pressure.
Effect and Function While the oxygen partial pressure in this example is 0.08 atm, the oxygen partial pressure may be values other than 0.08 atm. However, it is unsuitable to be less than 0.01 atm since the formation of the superconducting material itself is not sufficiently conducted, and it is also unsuitable to exceed 0.2 atm since the formation of impurities is promoted.

Therefore, it is preferred that the oxygen partial pressure is in a range of from 0.01 to 0.2 atm.

EXAMPLE 10-2

When heat treatment was conducted in the same manner as in Example 10-1 except that the total pressure was changed from 1 atm to 1.5 atm or more, the critical electric current density Jc was 3.5 kA/cm$^2$.

From the result the critical electric current density Jc was found to increase by conducting the heat treatment under a pressurized atmosphere of 1.5 atm or more.

EXAMPLE 10-3

Production Process

Heat treatment was conducted in the same manner as in Example 10-1 except that the first temperature varied an interval of 5° C. from 825 to 845° C., so as to produce superconducting wires as heat-treated metallic sheath wires. The second temperature was lower than the first temperature by 5° C.

Result

The resulting metallic sheath wires were evaluated for the relationship between the respective first temperatures and the critical electric current densities at the temperature of liquid nitrogen, which was found to be as follows:

| | |
|---|---|
| 825° C. | 1.1 kA/cm$^2$ |
| 830° C. | 2.8 kA/cm$^2$ |
| 835° C. | 3.2 kA/cm$^2$ |
| 840° C. | 2.5 kA/cm$^2$ |
| 845° C. | 1.5 kA/cm$^2$ |

Thus, it was found that high critical electric current densities could be obtained at the first temperature of from 830 to 840° C.

EXAMPLE 11

Production Process

Superconducting wires as treated metallic sheath wires were produced by conducting heat treatment at 650° C. in the same manner as in Example 7-1 except that the pressure was changed to $1 \times 10^5$ Pa, $5 \times 10^3$ Pa, $2.5 \times 10^2$ Pa, 2.5 Pa and $5 \times 10^{-2}$ Pa.

Result

The superconducting wires were evaluated with the naked eye for the number of wire blisters per 10-m length, which was found to be as follows:

| | |
|---|---|
| $1 \times 10^5$ Pa | 8 |
| $5 \times 10^3$ Pa | 5 |
| $2.5 \times 10^2$ Pa | 0.5 |
| 2.5 Pa | 0.3 |
| $5 \times 10^{-2}$ Pa | 0.1 |

Thus, it was found that the number of wire blisters was decreased by reducing the pressure, and it was remarkably suppressed at $2.5 \times 10^2$ Pa or less.

Effect and Function

The wire blister is a phenomenon where the metallic sheath wire blisters due to formation of a gas by a reaction or formation of a gas from an adsorbed substance caused by heat treatment. In this example, on the other hand, the number of wire blisters formed is suppressed by reducing the pressure to create an environment where a gas is easily evacuated to the outside of the metallic sheath wire.

EXAMPLE 12

Production Process

A multi-filament tape-shaped metallic sheath wire of 61 cores having a length of 1 km, i.e., a metallic sheath wire 1, was obtained in the same manner as in the formation of the multi-filament tape-shaped metallic sheath wire of 61 cores in Example 8-1. One pancake 15 was formed by winding the metallic sheath wire together with the same ceramic sheet 7 as in Example 7-1.

The resulting pancake 15 was subjected to heat treatment at a first temperature of 840° C. for 50 hours. After decreasing the thickness by 10% by rolling, it was subjected to heat treatment at a second temperature of 835° C. for 50 hours. The selected temperature of 835° C. was lower than 840° C. by 5° C. During the process of increasing the temperature for heat treatment, several kinds of the temperature increasing time (hereinafter defined) were selected to conduct heat treatment. The term "temperature increasing time" herein means the period of time required for increasing the temperature to reach the prescribed temperature.

The basic conditions of the heat treatment were that the temperature was increased to 800° C. for 3 hours and from 800° C. to 840° C. for 2 hours, and after finally reaching the objective temperature, the heat treatment was conducted in an air atmosphere for 50 hours. After the heat treatment, the ceramic material was removed to obtain a superconducting wire as a treated metallic sheath wire.

Superconducting wires were obtained under the conditions where the temperature increasing time from 100° C. to 300° C. was changed to several values in comparison to the basic conditions.

Superconducting wires were also obtained under the condition where the temperature increasing time from 700° C. to 820° C. was changed to several values in comparison to the basic conditions.

Superconducting wires were also obtained under the condition where the temperature increasing time from 820° C. to 840° C. was changed to several values in comparison to the basic conditions.

Superconducting wires were further obtained under the conditions where the temperature increasing time from 100° C. to 300° C., the temperature increasing time from 700° C. to 820° C. and the temperature increasing time from 820° C. to 840° C. were changed in comparison to the basic conditions. In the ranges other than from 100° C. to 300° C., from 700° C. to 820° C. and 820° C. to 840° C., the temperature increasing time was 100° C. per hour.

Result

The resulting superconducting wires were measured for the variation in thickness in the longitudinal direction by a laser measuring apparatus, and the number of parts where the thickness was changed, i.e., parts where wire blister occurred. The results obtained are shown in Tables 1 to 4.

TABLE 1

| Temperature increasing time from 100° C. to 300° C. (hour) | Number of wire blisters per 100 m |
|---|---|
| 1 | 108 |
| 2 | 57 |
| 5 | 38 |

TABLE 1-continued

| Temperature increasing time from 100° C. to 300° C. (hour) | Number of wire blisters per 100 m |
|---|---|
| 10 | 28 |
| 20 | 25 |
| 50 | 19 |
| 100 | 15 |

TABLE 2

| Temperature increasing time from 700° C. to 820° C. (hour) | Number of wire blisters per 100 m |
|---|---|
| 1 | 55 |
| 2 | 35 |
| 5 | 18 |
| 10 | 17 |
| 20 | 15 |
| 50 | 10 |
| 100 | 7 |

TABLE 3

| Temperature increasing time from 820° C. to 840° C. (hour) | Number of wire blisters per 100 m |
|---|---|
| 1 | 53 |
| 2 | 39 |
| 5 | 30 |
| 10 | 28 |
| 20 | 16 |
| 50 | 15 |
| 100 | 9 |

TABLE 4

| Temperature increasing time from 100° C. to 300° C., 700° C. to 820° C. and 820° C. to 840° C. (hour) | Number of wire blisters per 100 m |
|---|---|
| 1 | 77 |
| 2 | 15 |
| 5 | 3 |
| 10 | 1 |
| 20 | 0 |
| 50 | 0 |
| 100 | 0 |

It was found from the results shown in Table 4 that when the temperature increasing time from 100° C. to 300° C., the temperature increasing time from 700° C. to 820° C. and the temperature increasing time from 820° C. to 840° C. was each 5 hours or more, and preferably 20 hours or more, the number of wire blisters could be remarkably decreased.

The gas released from the metallic sheath wire on the heat treatment was measured by thermo-gravimetry (TG), and it was found that the main components thereof were $H_2O$, $CO_2$ and $O_2$.

All the specific embodiments described in the foregoing are mere examples and are not restrictive. The scope of the invention is expressed by the scope of claims but not by the foregoing descriptions, and includes the scope of claims and all the changes within the equivalent meanings and ranges.

What is claimed is:

1. A process for producing a superconducting wire comprising:
    forming two or more pancakes by winding, in coil form, a metallic sheath wire and an overlapped ceramic protective tape that substantially does not restrict the behavior of said metallic sheath wire, said ceramic protective tape comprising both a fiber and a powder that do not disappear upon heat treatment, and a binder comprising a material that does disappear upon heat treatment,
    stacking said two or more pancakes using a separating means that substantially does not restrict the behavior of said metallic sheath wire, and
    subjecting said stacked pancakes to a heat treatment,
        wherein said separating means comprises alumina fibers as the main component.

2. A process for producing a superconducting wire as claimed in claim 1, wherein said separating means comprises a mixture of alumina fibers and magnesia powder.

3. A process for producing a superconducting wire as claimed in claim 1, wherein said separating means comprises a mixture of alumina fibers and silica.

4. A process for producing a superconducting wire as claimed in claim 1, wherein said ceramic protective tape comprises a mixture of alumina fibers and magnesia powder.

5. A process for producing a superconducting wire as claimed in claim 1, wherein said ceramic protective tape comprises a mixture of alumina fibers and silica.

6. A process for producing a superconducting wire as claimed in claim 1, wherein the length of said metallic sheath wire is at least 1 km.

7. A process for producing a superconducting wire as claimed in claim 1, wherein the length of said metallic sheath wire is at least 2 km.

8. A process for producing a superconducting wire as claimed in claim 1, wherein the length of said metallic sheath wire is at least 3 km.

9. A process for producing a superconducting wire as claimed in claim 1, wherein the length of said metallic sheath wire is at least 4 km.

10. A process for producing a superconducting wire as claimed in claim 1, wherein said separating means is a protective layer.

11. A process for producing a superconducting wire as claimed in claim 10, wherein said protective layer comprises, as a main component, at least a fiber or powder comprising a material that does not disappear by said heat treatment and a binder comprising a material that disappears by said heat treatment.

12. A process for producing a superconducting wire as claimed in claim 10, wherein said protective layer comprises a means for continuing said metallic sheath wire between adjacent pancakes.

13. A process for producing a superconducting wire as claimed in claim 12, wherein said means for continuing said metallic sheath wire is a spiral groove provided in said protective layer, in which said metallic sheath wire is passed substantially without restriction.

14. A process for producing a superconducting wire as claimed in claim 10, wherein said metallic sheath wire is formed by filling powder of an oxide superconducting material or raw material powder thereof in a metallic sheath, and then subjecting it to deformation processing.

15. A process for producing a superconducting wire as claimed in claim 14, wherein said heat treatment comprises a first heat treatment conducted at a first temperature of from 840 to 850° C., and a second heat treatment conducted at a second temperature that is lower than said first temperature by 5° C.

16. A process for producing a superconducting wire as claimed in claim 14, wherein said heat treatment is conducted under an atmospheric pressure of $2.5 \times 10^2$ Pa or less.

17. A process for producing a superconducting wire as claimed in claim 14, wherein said heat treatment is conducted under an atmospheric pressure of 1.5 or more.

18. A process for producing a superconducting wire as claimed in claim 14, wherein said heat treatment is conducted at a temperature of from 840 to 850° C.

19. A process for producing a superconducting wire as claimed in claim 18, wherein said heat treatment is conducted at a temperature increasing time from 100° C. to 300° C., a temperature increasing time from 700° C. to 820° C. and a temperature increasing time from 820° C. to 840° C. each for 5 hours or more.

20. A process for producing a superconducting wire as claimed in claim 14, wherein said heat treatment is conducted at an oxygen partial pressure of from 0.01 to 0.2 atm.

21. A process for producing a superconducting wire as claimed in claim 20, wherein said heat treatment comprises a step conducted at a first temperature of from 840 to 850° C., and a step conducted at a second temperature that is lower than said first temperature by 50° C.

* * * * *